(12) United States Patent
Chen

(10) Patent No.: US 6,437,614 B1
(45) Date of Patent: Aug. 20, 2002

(54) LOW VOLTAGE RESET CIRCUIT DEVICE THAT IS NOT INFLUENCED BY TEMPERATURE AND MANUFACTURING PROCESS

(75) Inventor: Lin-Chien Chen, Yun Kang (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 09/863,331

(22) Filed: May 24, 2001

(51) Int. Cl.[7] .................................................. H03L 7/00
(52) U.S. Cl. .......................... 327/143; 327/53; 327/56; 327/78; 327/81; 327/83; 327/143; 327/198; 327/513; 327/530; 327/538
(58) Field of Search ............................. 327/83, 78, 81, 327/53, 56, 513, 538, 143, 530, 198

(56) References Cited

U.S. PATENT DOCUMENTS 4,902,910 A  *  2/1990  Hsieh ....................... 307/296.4

* cited by examiner

Primary Examiner—Margaret R. Wambach
(74) Attorney, Agent, or Firm—Bacon & Thomas

(57) ABSTRACT

A low voltage reset circuit device without being influenced by temperature and manufacturing process is formed by a first low voltage reset circuit using an energy gap circuit to generate a reference voltage, and a second low voltage reset circuit using a threshold voltage of a MOS transistor as a reference voltage. The first low voltage reset circuit is used to provide an accurate low voltage reset property,. while the circuit only works as VDD>1.2V. When VDD<1.2V, the second low voltage reset circuit still works normally for providing the desired reset signal thereby covering the low VDD voltage range.

6 Claims, 6 Drawing Sheets

LOW VOLTAGE RESET CIRCUIT DEVICE THAT IS NOT INFLUENCED BY TEMPERATURE AND MANUFACTURING PROCESS

BACKGROUND OF THE INVENTION

1. Field of the Invention

The present invention relates to low voltage reset circuit and, more particularly, to a low voltage reset circuit device without being influenced by temperature and manufacturing process.

2. Description of Related Art

FIG. 7 shows a conventional low voltage reset circuit, in which the base-embitter junction voltage (Vbe) of a BJT transistor 71 is used as a reference voltage. The resistors R2 and R3 are used to divide the voltage VDD so as to acquire a desired voltage being a determined ratio of the voltage source. A comparator 72 is used to compare the two voltages for generating a low voltage reset signal. This conventional circuit has two drawbacks. One is that the temperature coefficient of the Vbe is large and thus the operating temperature will negatively influence the detected voltage. The other drawback is that the resistors R2 and R3 will establish a direct current path. The voltage across the R2 and R3 is VDD. The current flowing through the R2 and R3 is I=VDD/(R2+R3). If R2 and R3 are small (for example 100 k) and VDD is assumed to be 3V, this path will cause a power consumption of 30 $\mu$A. If the resistor R2 and R3 are increased to be, for example, 500K for saving power, the resistors will occupy a large layout area in the integrated circuit, which results in a high implementation cost (in the 0.6 $\mu$m CMOS manufacturing process, the N-well is frequently used as a resistor and, in average, a resistor of 1K occupies an area of 12 $\mu$m×12 $\mu$m).

In order to avoid that the temperature effect causes a shift of the reset voltage, as shown in FIG. 8, an energy gap circuit 81 can be used to replace the BJT transistor to generate a reference voltage, and the voltage VDD is so divided through resistors R2 and R3 so as to acquire a voltage being a determined ratio of the voltage source. A comparator 82 is provide to compare the two voltages so as to generate a low voltage reset sign. This conventional circuit can be used to avoid the possible shift caused by the temperature. However, the problems of high power consumption due to the voltage dividing of the resistors and large resistor layout area are not eliminated. Therefore, it is desirable to provide an improved low voltage reset circuit without being affected by temperature and manufacturing process to mitigate and/or obviate the aforementioned problems.

SUMMARY OF THE INVENTION

The object of the present invention is to provide a low voltage reset circuit device without being influenced by temperature and manufacturing process, in which the detection of voltage range is complete, the reference voltage to be compared is accurate, and the resistor is small so as not to occupy too much layout area in the integrated circuit.

To achieve the object, there is provided a low voltage reset circuit device for detecting a voltage source to automatically generate a system low voltage reset signal. The low voltage reset circuit comprising: a first low voltage reset circuit using an energy gap circuit to generate a reference, voltage for being compared with the voltage source, so as to output a first reset signal when the voltage source is smaller than a first voltage; a second low voltage reset circuit using a threshold voltage of a MOS transistor as a reference voltage to be compared with the voltage source, so as to generate a second reset signal when the voltage source is smaller than a second voltage, wherein the second voltage is between the first voltage and a lowest voltage at which the energy gap circuit can operate; and a logic circuit for generating a system low voltage reset signal when one of the low voltage reset circuits generates a reset signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
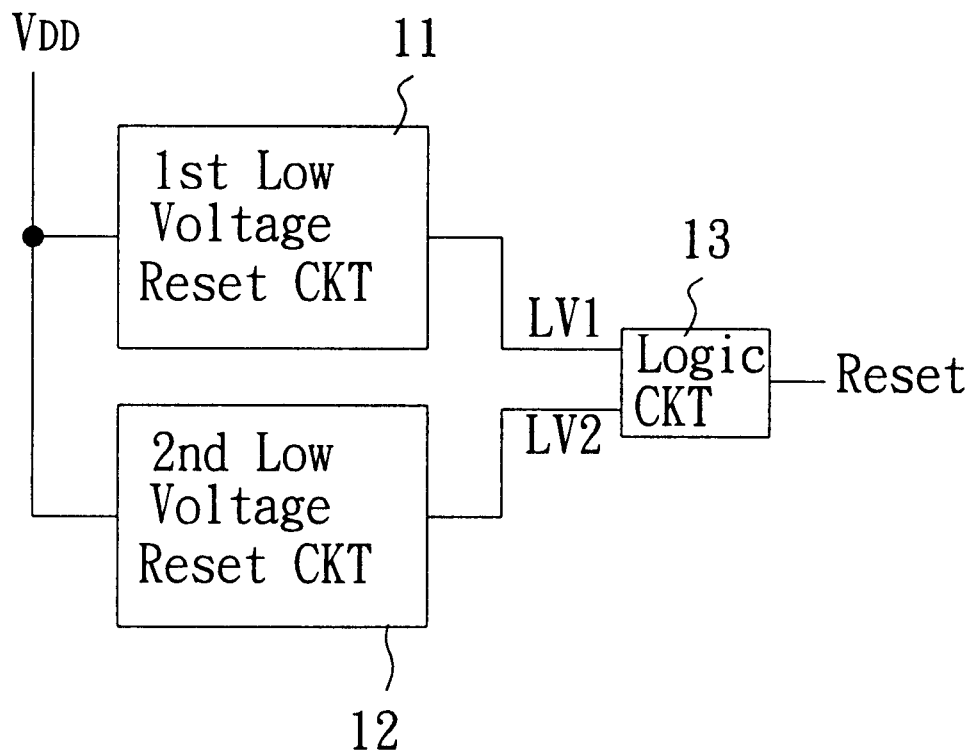
FIG. 1 shows the structure of a low voltage reset circuit device without being influenced by temperature and manufacturing process in accordance with the present invention.

With reference to FIG. 1, a preferred embodiment of the low voltage reset circuit device without being effected by temperature and manufacturing process according to the present invention is illustrated, which includes a first low voltage reset circuit 11, a second low voltage reset circuit 12, and a logic circuit 13. The first low voltage reset circuit 11 utilizes an energy gap circuit to generate a reference voltage for being compared with the voltage source VDD so as to generate a first reset signal (LV1=0) at an output LV1. The second low voltage reset circuit 12 utilizes the threshold voltage of a MOS transistor as a reference voltage for being compared with the voltage source VDD so as to generate a second reset signal (LV2=0) at the output LV2. The detecting outputs LV1 and LV2 of the first and second low voltage reset circuits 11 and 12 are connected to the logic circuit 13 so as to generate a desired reset signal (Reset=0) at the output, as denoted by Reset, of the logic circuit 13.

Figure 2:
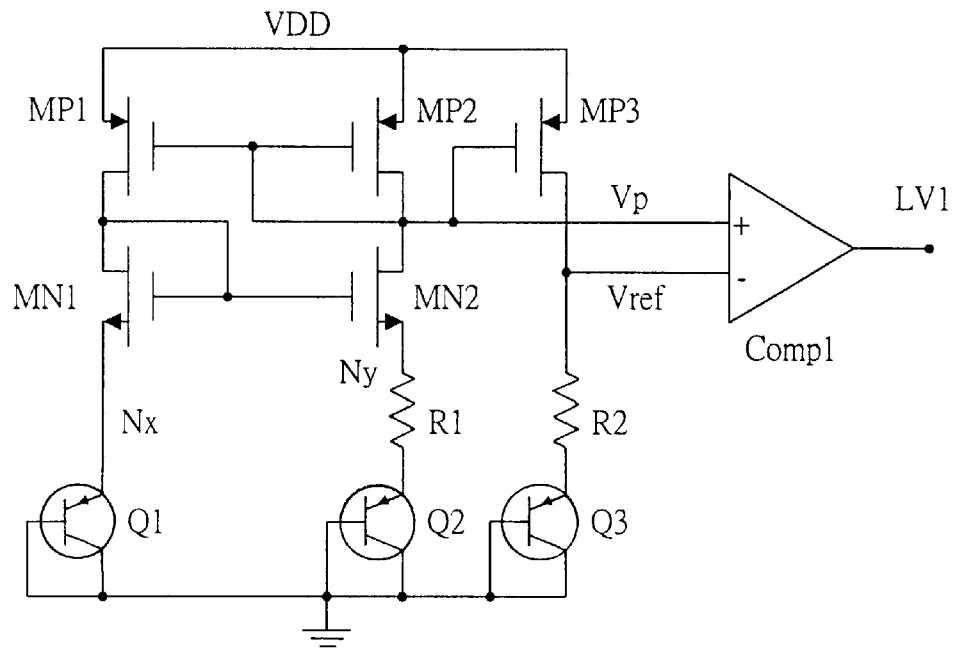
FIG. 2 is a circuit diagram of the first low voltage reset circuit shown in FIG. 1.

FIG. 2 is the detail circuit diagram of the first low voltage reset circuit 11, wherein the MOS transistors MP1, MP2, MP3, MN1 and MN2, the BJT transistors Q1, Q2 and Q3, and resistors R1 and R2 together form an energy gap circuit to provide an energy gap reference voltage Vref. In this circuit, the transistors MP1, MP2, and MP3 have the same size. The transistors MN1 and MN2 have the same size. The transistors MP1, MP2 and MN1, MN2 are symmetric. Thus, the voltages on the nodes Nx and Ny are equal, while the area of the emitters of the transistors Q1 and Q2 are preset to be equal to a determined ratio (for example, Q1:Q2=1:8). The voltage across the resistor R1 is ΔVbe=Vbe2−Vbe1, where Vbe represents the base-emitter voltage of a BJT transistor. Since the size of the transistor MP3 is identical to that of the transistor MP1 and if the area of the emitter of the transistor Q3 is equal to that of transistor Q1, the current passing through the transistor MP1 is also equal to that passing through the MP3, and Vbe1=Vbe3, so as to have:

$$Vref=Vbe3+(R2/R1)*\Delta Vbe=Vbe3+(R2/R1)*Vt*\ln(n),$$

where n is the ratio of emitter area of Q2 to Q1. Since ΔVbe in the circuit has a positive temperature coefficient, and the Vbe has a negative temperature coefficient, a Vref capable of not being influenced by temperature can be acquired by appropriately adjusting the values of resistors R1 and R2.

In order to compare with the voltage source VDD, in the first low voltage reset circuit 11, the drain of transistor MP2, whose source is connected to the VDD, is connected to its gate, so as to provide a voltage source representing voltage Vp at the connection point. The value of Vp is equal to the voltage source VDD subtracted by the threshold voltage Vtp of the transistor MP2. This voltage source representing voltage Vp and the reference voltage Vref are fed to the positive and negative input ends of the comparator Comp1 for being compared with each other. When the voltage source VDD is smaller than a voltage Va, it results in Vp<Vref, and the output LV1 of the comparator Comp1 is in logic 0. On the contrary, when the voltage source VDD is larger than the voltage Va, it results in Vp>Vref, and the output LV1 of the comparator Comp1 is logic 1. Therefore, this circuit may generate a reset signal (LV1=0) when the voltage source VDD is lower than Va.

Figure 3A:
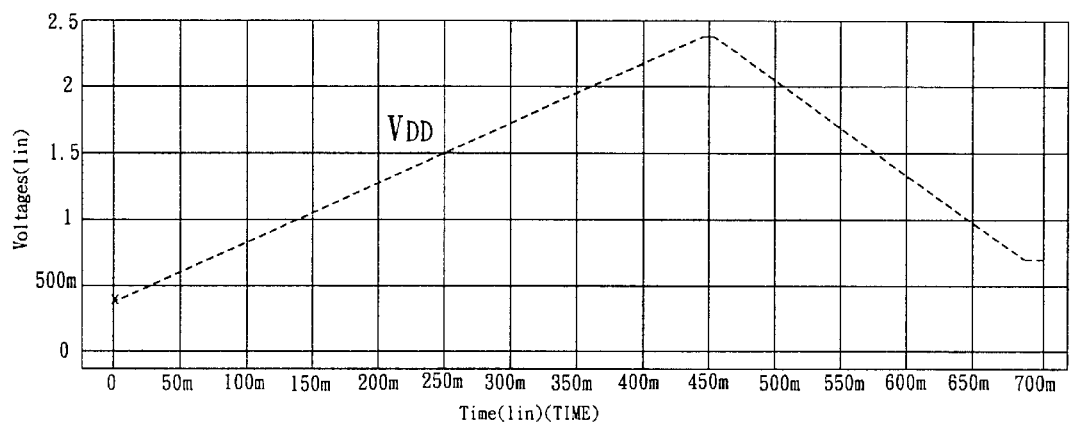
FIG. 3a shows the operating waveform of the voltage source of the first low voltage reset circuit in accordance with the present invention.
Figure 3B:
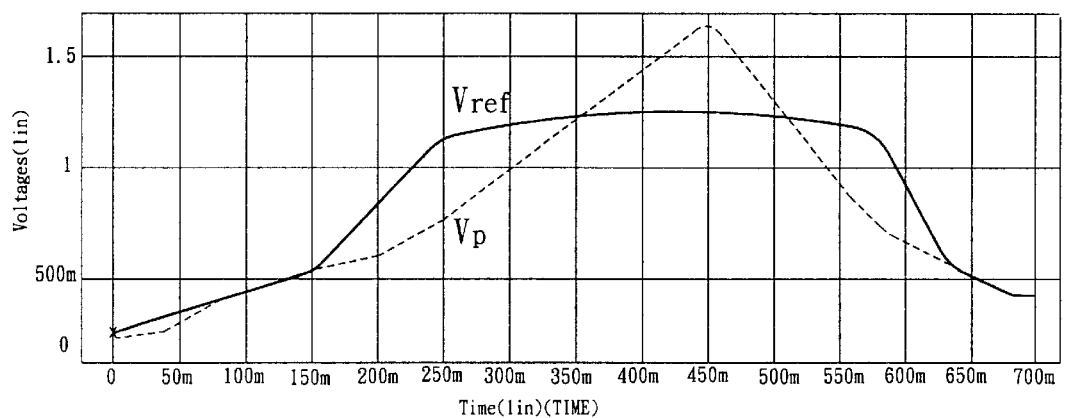
FIG. 3b shows the operating waveforms of the reference voltage and the voltage source representing voltage of the first low voltage reset circuit.

Since the first low voltage reset circuit 11 generates a reference voltage through an energy gap circuit, it is able to detect the variation of temperature precisely without being influenced by temperature. Referring to FIG. 3a, as the voltage source VDD increases from 0V and then decreases, the voltage variations of the Vref and the Vp are illustrated in FIG. 3b. When the voltage source VDD is smaller than a voltage Vb (=1.2V), the energy gap circuit can not work normally and the relation between the Vp and Vref is unknown. If Vb (1.2V) <VDD<Va (2V), it results in Vref>Vp. If VDD>Va (2V), it results in Vref<Vp. Therefore, by using the comparator Comp1 to compare the Vref with the Vp, it can determine whether the VDD is larger than 2V. Since the circuit will compensate the temperature loss and a reference voltage is generated through a bipolar junction transistor, the output is not influenced by the temperature and the shift of the manufacturing process.

Figure 4:
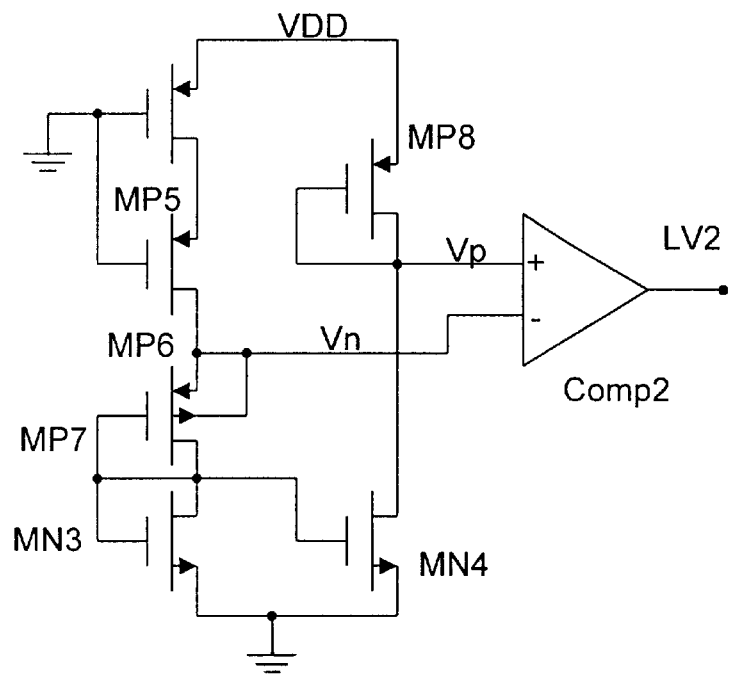
FIG. 4 is a circuit diagram of the second low voltage reset circuit shown in FIG. 1.

FIG. 4 is the detail circuit diagram of the second low voltage reset circuit 12, which utilizes a threshold voltage of a MOS transistor as a reference voltage. The gates of the PMOS transistors MP5 and MP6 connected in series are grounded so as to form as a resistor. The drain and gate of the NMOS transistor MN3 are connected, and thus its $V_{SD}$ is equal to the threshold voltage Vnth3 of the transistor MN3. Furthermore, since the transistor MP7 is connected to the transistor MN3 before being grounded, its source voltage is considered to be a threshold reference voltage Vn obtained by adding the threshold voltages Vpth7 and Vnth3 (i.e., Vn=Vpth7+Vnth3). In addition, the NMOS transistors MN4 and MN3 are formed as a current mirror to provide the bias current to the transistor MP8. The PMOS transistor MP8, whose source is connected to the voltage source VDD, has a drain connected to its gate, and thus, the voltage of the drain is "VDD−Vpth8." This voltage can be used as the voltage source representing voltage Vp, which and the threshold reference voltage Vn are fed to the positive and negative input ends of the comparator Comp2 for comparing the values of the two. When the voltage source VDD is smaller than a voltage Vd, it results in Vp<Vn, and the output LV2 of the comparator Comp2 is logic 0. On the contrary, when the voltage source VDD is larger than the voltage Vd, it results in Vp>Vn, and the output LV2 of the comparator Comp2 is logic 1. As a result, this circuit may generate a reset signal (LV2=0) as the voltage source VDD is lower than Vd.

Figure 5A:
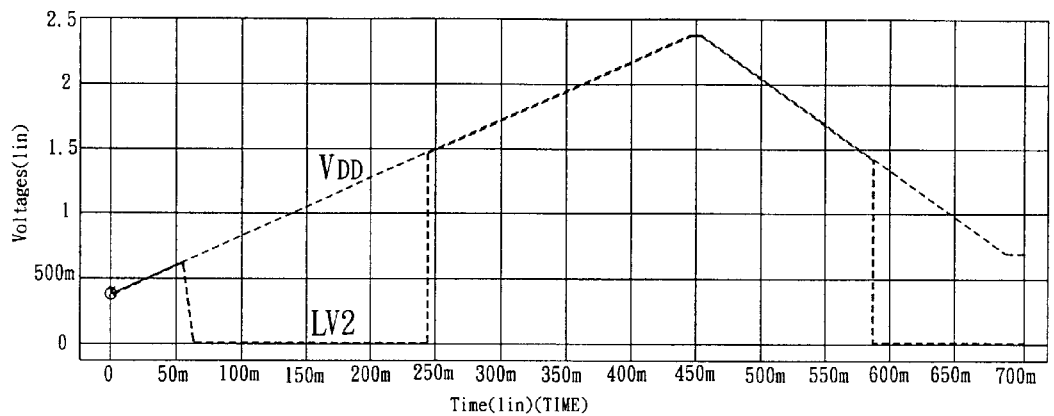
FIG. 5a shows the operating waveforms of the voltage source and reset signal of the second low voltage reset circuit.
Figure 5B:
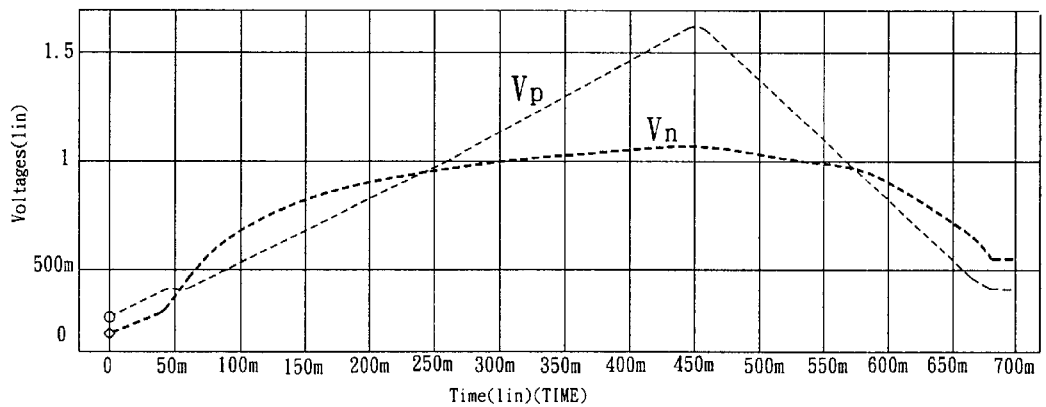
FIG. 5b shows the operating waveforms of the reference voltage and voltage source representing voltage of the second low-voltage reset circuit.

Since the threshold voltage is used as a reference voltage in the second low voltage reset circuit 12, the problems of the large power consumption and large resistor layout caused by using resistors for dividing voltage can be eliminated. However, the detected voltage Vd of this circuit will be changed due to the shift of manufacturing process or the temperature effect. However, when the voltage source VDD approaches to a system low voltage (VSS), the circuit can still work normally Referring to FIG. 5a, as the VDD increases from 0V and then decrease the voltage variations of the Vn and Vp are illustrated in FIG. 5b, in which as the VDD is smaller than 1.2V, it still works normally.

Figure 6:
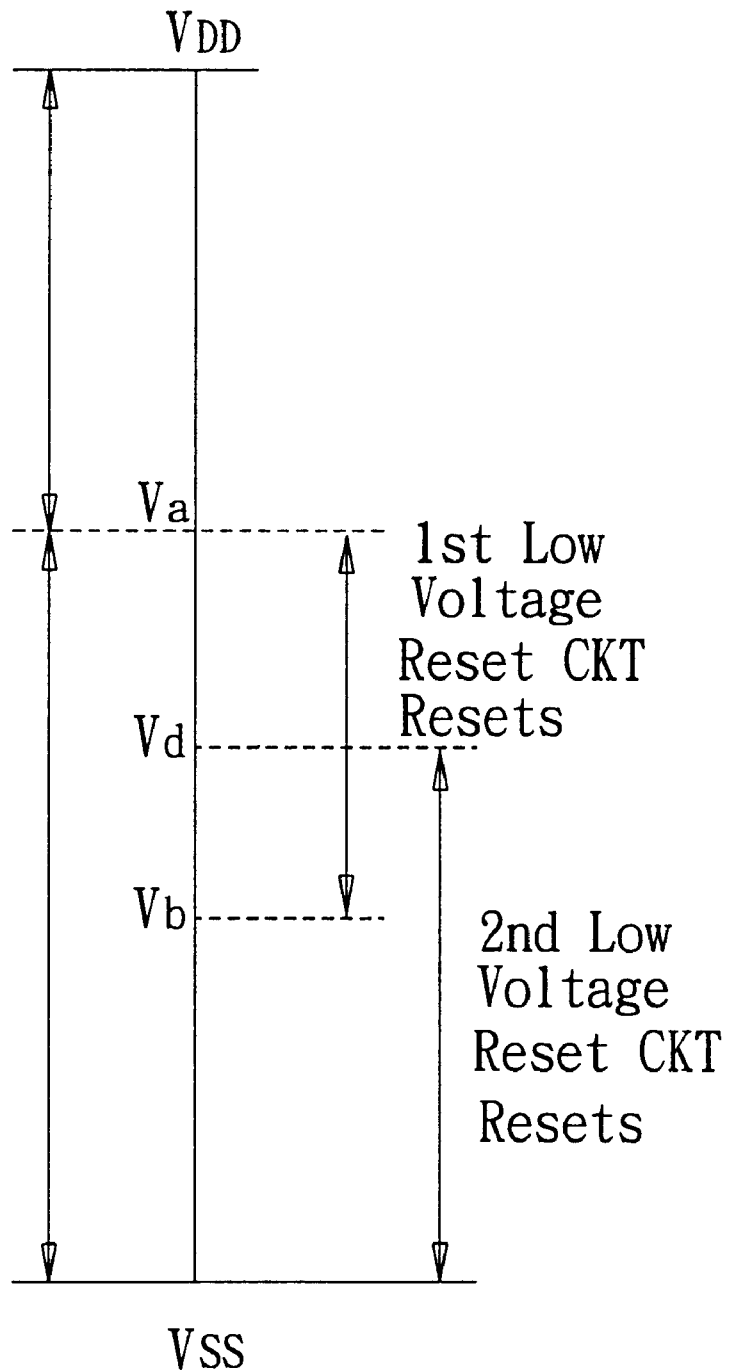
FIG. 6 shows the voltage range for the reset signals generated by the first and second low voltage reset circuit.
Figure 8:
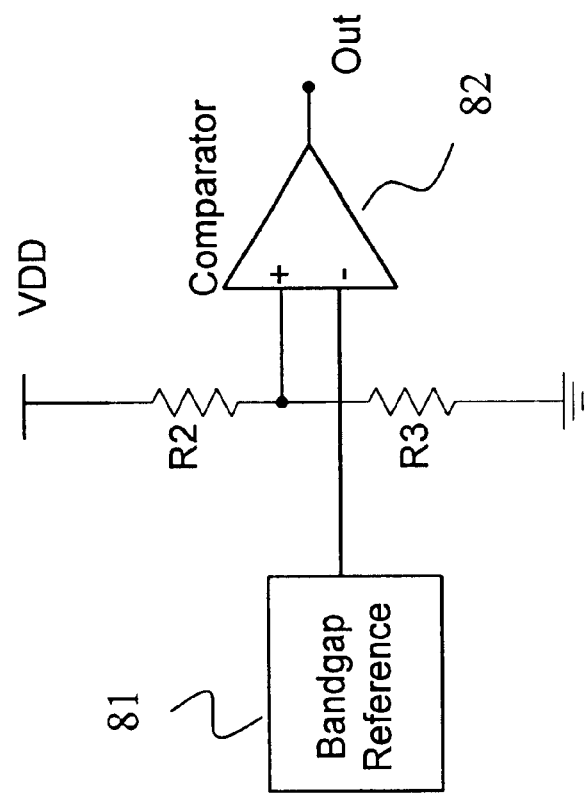
FIG. 8 shows another conventional low voltage reset circuit.
Figure 7:
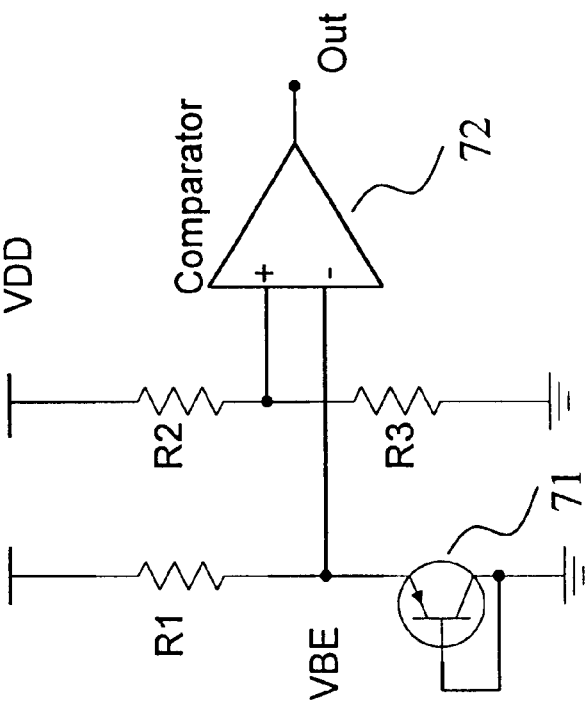
FIG. 7 shows a conventional low voltage reset circuit.

With reference to FIG. 6, the first low voltage reset circuit 11 may precisely provide a low voltage reset property, so as to generate a reset signal (LV=1) when the VDD is smaller than Va; but it must work at VDD>Vb (1.2V). However, the second low voltage reset circuit 12 still works normally as the VDD<1.2V. Therefore, Vd is designed to be between Va and Vb (i.e., Vb<Vd<Va). Accordingly, the properties of the first low voltage reset circuit 11 and second low voltage reset circuit 12 can be combined to generate a low voltage reset signal when the VDD is between VSS and Va.

Therefore, referring to FIG. 1, the present invention utilizes a logic circuit 13 to process the outputs (LV1 and LV2) of the first low voltage reset circuit 11 and the second low voltage reset circuit 12 to generate a system low voltage reset signal at the output Reset. The logic circuit 13 generates a system low voltage reset signal (Reset=0) based on the following conditions:

(A) When 0<VDD<Vb, the second reset signal (LV2=0) output from the second low voltage reset circuit 12 is used to generate a low voltage reset signal.

(B) When Vb<VDD<Vd, the first and second reset signals (LV1=0, LV2=0) of the first and second low voltage reset circuits 11 and 12, respectively, are simultaneously used to generate a low voltage reset signal.

(C) When Vd<VDD<Va, the first reset signal (LV1=0) output from the first low voltage reset circuit 11 is used to generate a low voltage reset signal.

When VDD>Va, there is no reset signal generated, and the system starts to work. Referring to FIG. 1, in this preferred embodiment, the logic circuit 13 is realized by a logic AND gate. The two input ends of the logic AND gate are connected to the outputs LV1 and LV2 of the first and second low voltage reset circuits 11 and 12. Thus, the outputs of the first and second low voltage reset circuit 11 and 12 is performed with a logic AND operation, thereby generating a system low voltage reset signal.

In view of the foregoing, it is known that, in the present invention, the low voltage reset circuit using the energy gap circuit is provided to precisely detect the variation of the VDD, and further, the low voltage reset circuit using the threshold voltage of a MOS is provided to detect the voltage as VDD is smaller than 1.2V, so that the voltage detecting range is complete. Moreover, the reference point of the reset voltage is the output voltage of the energy gap circuit plus the threshold voltage of a MOS transistor. Since the energy gap circuit can generate an accurate reference voltage, it has a smaller temperature coefficient and is not related to the shift of the threshold voltage in the manufacturing process. Therefore, the reset reference voltage is only affected by the variation of one threshold voltage, which is three times less than that of a low voltage reset circuit which employs only the threshold voltage of the MOS transistor. Besides, in the circuit (referring to FIG. 2), the voltages across the resistors R1 and R2 are $VT\ln(N) \approx 0.059V$ and $(R2/R1)VT \ln(N) \approx 0.59V$ which are far smaller than VDD (3V~5V). Therefore, under the same current consumption, the resistor used is far smaller than the voltage-dividing resistor in the prior art. Therefore, the occupied circuit layout in the integrated circuit is smaller so that the implementation cost is low.

Although the present invention has been explained in relation to its preferred embodiment, it is to be understood that many other possible modifications and variations can be made without departing from the spirit and scope of the invention as hereinafter claimed.

What is claimed is:

1. A low voltage reset circuit device for detecting a voltage level of a voltage source to automatically generate a system low voltage reset signal, the low voltage reset circuit comprising:

a first low voltage reset circuit using a bandgap circuit to generate a first reference voltage for being compared with the voltage level of the voltage source, so as to output a first reset signal when the voltage level of the voltage source is smaller than a first voltage;

a second low voltage reset circuit using a threshold voltage of a MOS transistor as a second reference voltage to be compared with the voltage level of the voltage source, so as to generate a second reset signal when the voltage level of the voltage source is smaller than a second voltage, wherein the second voltage is between the first voltage and a lowest voltage at which the bandgap circuit can operate; and a logic circuit for generating a system low voltage reset signal when one of the low voltage reset circuits generates a reset signal.

2. The low voltage reset circuit device as claimed in claim 1, wherein the first low voltage reset circuit includes the bandgap circuit for generating a reference voltage, and a comparator for comparing the first reference voltage with a second voltage source representing voltage level, sol as to generate a first reset signal at an output of the comparator when the voltage level of the voltage source is smaller than the first voltage, wherein the second voltage source representing voltage level is equal to the voltage level of the voltage source subtracted by the threshold voltage of a MOS transistor in the bandgap circuit.

3. The low voltage reset circuit device as claimed in claim 1, wherein the second low voltage reset circuit includes a first and a second transistor, the first transistor being an NMOS transistor having a drain and a gate connected together for providing a first threshold voltage between the drain and the source, the second transistor being a PMOS transistor having a drain and a gate connected together for providing a second threshold voltage between the source and drain, the sec nd transistor being connected to the first transistor before being grounded so as to generate the second reference voltage, said second reference voltage being equal to a sum of the first and second threshold voltages at the source.

4. The low voltage reset circuit device as claimed in claim 3, wherein the second low voltage reset circuit further includes a third and a fourth transistor, the third transistor being a PMOS transistor having a source connected to the voltage source, and a drain connected to its gate, so as to generate said second voltage source representing voltage level equal to the voltage level of the voltage source subtracted by the threshold voltage of the third transistor.

5. The low voltage reset circuit device as claimed in claim 4, wherein the second low voltage reset circuit further includes a comparator for comparing the second reference voltage with the second voltage source representing voltage level, so as to generate a first reset signal at the output of the comparator when the voltage level of the voltage source is smaller than the second voltage.

6. The low voltage reset circuit device as claimed in claim 4, wherein the logic circuit is a logic AND gate for performing a logic AND operation on outputs of said first and said second low voltage reset circuits so as to output a system low voltage reset signal.

* * * * *